United States Patent
Yip (10) Patent No.: US 6,842,091 B2
(45) Date of Patent: Jan. 11, 2005

(54) WEIGHTED SAW REFLECTOR GRATING USING DITHERED ACOUSTIC REFLECTORS

(75) Inventor: David S. Yip, La Mirada, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 55 days.

(21) Appl. No.: 10/377,333

(22) Filed: Feb. 28, 2003

(65) Prior Publication Data

US 2004/0169569 A1 Sep. 2, 2004

(51) Int. Cl.$^7$ .............................. H03H 9/64; H03H 9/25
(52) U.S. Cl. .................... 333/195; 333/196; 310/313 D
(58) Field of Search ................................ 333/193–196; 310/313 B, 313 D (56) References Cited

U.S. PATENT DOCUMENTS

| | | | |
|---|---|---|---|
| 4,281,301 A | * 7/1981 | Stevens et al. | 333/195 |
| 4,484,160 A | * 11/1984 | Riha | 333/195 |
| 5,289,073 A | * 2/1994 | Mariani | 310/313 D |
| 5,365,206 A | * 11/1994 | Machui et al. | 333/195 |
| 5,475,348 A | 12/1995 | Hode et al. | 333/195 |
| 5,661,444 A | 8/1997 | Dill et al. | 333/195 |
| 5,896,072 A | * 4/1999 | Bergmann et al. | 333/195 |
| 6,104,260 A | 8/2000 | Yamada et al. | 333/193 |

FOREIGN PATENT DOCUMENTS

| | | |
|---|---|---|
| DE | 42 13 117 A1 * | 10/1993 |
| EP | 0 614 272 A | 9/1994 |
| EP | 1 003 286 A2 | 5/2000 |

OTHER PUBLICATIONS

Dill, R. et al., A Novel SAW Filter for IF–Filtering in DECT Systems:, Ultrasonics Symposium, 1995 IEEE Proceedings., 1995 IEEE, Seattle, WA, USA, Nov. 7–10, 1995, New York, NY, USA, IEEE, US, Nov. 7, 1995, pp. 51–54.

Woods, R.C., "Dispersive Delay Lines Using 180 degrees Reflecting Metal Dot Arrays", Ultrasonics Symposium Proceedings, San Diego, CA, USA, vol. 1, Oct. 29, 1982, pp. 88–91, New York, NY.

Riha, G., et al., "RAC–Filters with Position Weighted Metallic Strip Arrays", Proceedings of the Ultrasonics Symposium, San Diego, CA, USA, Oct. 27–19, 1982, vol. 1, Oct. 29, 1982, pp. 83–87.

* cited by examiner

*Primary Examiner*—Barbara Summons
(74) *Attorney, Agent, or Firm*—John A. Miller; Warn, Hoffmann, Miller & LaLone, P.C.

(57) ABSTRACT

A reflective grating (36) for a SAW filter (10) or resonator. The reflective grating (36) is formed by selectively dithering grating grid lines (38) with respect to a uniform spaced grid of M number of grid lines (38) per each N wavelength ($\lambda$) of the grating (36) (N$\lambda$/M), where $\lambda$ is the wavelength of the center of the frequency band of interest, M and N are integers and M>N. M and N are selected so that the grating (36) does not have a net reflection when all of the grid lines (38) are uniformly spaced. By controlling the dithering pattern of the grid line in each sampling period of N$\lambda$, any desired net distributed reflectivity from the grating can be implemented in both magnitude and phase.

29 Claims, 6 Drawing Sheets

$\lambda_1 < \lambda_2 < \cdots \lambda_N$

Figure 10c

WEIGHTED SAW REFLECTOR GRATING USING DITHERED ACOUSTIC REFLECTORS

BACKGROUND OF THE INVENTION

1. Field of the Invention

This invention relates generally to a weighted surface acoustic wave (SAW) reflector for use in a SAW reflector filter or SAW resonator and, more particularly, to a weighted SAW reflector for use in a SAW reflector filter or resonator, where the reflector includes reflector grid lines selectively dithered relative to uniformly spaced grid lines that have M grid lines per each $N\lambda$, where $\lambda$ is the wavelength of the center frequency of the frequency band of interest, M and N are integers and M>N.

2. Discussion of the Related Art

Intermediate frequency (IF) filters are employed for channel selection in mobile phone communications systems, such as CDMA and GSM. The IF filters must be small in size and provide narrow bandwidths with steep transition edges and good out of band rejection. One type of filter that provides these properties is known in the art as a surface acoustic wave (SAW) filter.

Conventional SAW filters include an input transducer and an output transducer formed on a piezoelectric substrate. The input transducer is electrically excited with the electrical input signal that is to be filtered. The input transducer converts the electrical input signal to surface acoustic waves, such as Rayleigh waves, lamb waves, etc., that propagate along the substrate to the output transducer. The output transducer converts the acoustic waves to a filtered electrical signal.

The input and output transducers typically include interdigital electrodes formed on the top surface of the substrate. The shape and spacing of the electrodes determines the center frequency and the band shape of the acoustic waves produced by the input transducer. Generally, the smaller the width of the electrodes, or the number of electrodes per wavelength, the higher the operating frequency. The amplitude of the surface acoustic waves at a particular frequency is determined by the constructive interference of the acoustic waves generated by the transducers.

The combined length of the transducers determines the length of the overall filter. To design a conventional SAW filter with ideal filter characteristics, the filter's impulse response needs to be very long. Because the length of the impulse response is directly proportional to the length of the transducer, the overall length of a conventional SAW filter having ideal characteristics would be too long to be useful in mobile phone communications systems.

Reflective SAW filters have been developed to satisfy this problem. Reflective SAW filters generally have at least one input transducer, one output transducer and one reflector formed on a piezoelectric substrate. The reflector is typically a reflective grating including spaced apart grid lines defining gaps therebetween. The acoustic waves received by the reflector from the input transducer are reflected by the grid lines within the grating so that the reflected waves constructively and destructively interfere with each other and the wave path is folded. The constructively interfered waves are reflected back to the output transducer having a particular phase. Because of the folding, the length of the transducer is no longer dependent on the duration of the impulse response. Reflective SAW filters are, therefore, smaller in size and have high frequency selectivity, and thus are desirable for mobile phone communication systems.

The frequency response of a reflective SAW filter is further improved by weighting the individual reflectors to achieve a desired net reflectivity. Existing weighting methods include position-weighting, omission-weighting, and strip-width weighting. Other methods of weighting reflectors include changing the lengths of open-circuited reflective strips within an open-short reflector structure. Weighting the reflector helps to reduce the physical size of the filter and to improve the filter's frequency response.

An ideal frequency response for a reflector SAW filter has steep transition edges. The reflective gratings in a reflector SAW filter are weighted by a suitable weighting function to provide the desired filter response. For example, a weighted $\sin(x)/x$ function can be implemented in each reflective grating to generate a filter response having very steep transition edges.

Existing weighting techniques include position-weighting, omission-weighting and strip-width weighting. Other methods of weighting reflective gratings include changing the length of open-circuited reflective strips within an open-short reflector structure. Weighting the reflective grating helps to reduce the physical size of the filter and improve the filters frequency response.

The weighted reflective grating acts as a key element in the reflector SAW filter by reducing the physical size of the filter and improving the electrical filter response. A size reduction of 70% and an insertion loss of around 8 dB has been reported in the art using a Z-path reflector filter compared to in-line filter structures. One known reflective filter is a Z-path IF SAW filter for CDMA mobile phones.

The known methods of weighting a reflective grating in a SAW filter are all dependent upon the critical dimension of the reflector structure. The critical dimension is the smaller of the reflective grating grid width or the gap width, and is inversely proportional to the operating frequency of the filter. As the operating frequency increases, the critical dimension decreases. Fabrication constraints limit the critical dimension, thus limiting the operating frequency of the filter. As the operating frequency of the filter increases, the known reflective gratings have a limited dynamic range when implementing a wide range of reflectivity, which is required for filters with high selectivity. A reflective grating that provides strong reflectivity at a given frequency and critical dimension would be advantageous.

BRIEF SUMMARY OF THE INVENTION

In accordance with the teachings of the present invention, a new type of reflective grating for a SAW filter or resonator is disclosed. The grating is formed by selectively dithering grating grid lines with respect to a predetermined uniform or periodic spaced grid lines defined by M grid lines per each N wavelength ($N\lambda/M$), where $\lambda$ is the wavelength of the center frequency of the frequency, fo, band of interest, M and N are integers and M>N. M and N are selected so that the grating does not have a net reflection when all of the grid lines are uniformly spaced, i.e., no dithering. $\lambda$ is defined as V/fo, where V is the propagation velocity of the surface acoustic waves on the substrate. By providing a specific dithering pattern of the grid lines in each sampling period of $N\lambda$, any desired net distributed reflectivity from the grating can be implemented in both magnitude and phase.

Additional advantages and features of the present invention will become apparent from the following description and appended claims, taken in conjunction with the accompanying drawings.

DETAILED DESCRIPTION OF THE INVENTION

The following discussion of the embodiments of the invention directed to a weighted surface acoustic wave reflector for a SAW filter, where the reflector includes dithered reflector grid lines, is merely exemplary in nature, and is in no way intended to limit the invention or its application or uses.

Figure 1:
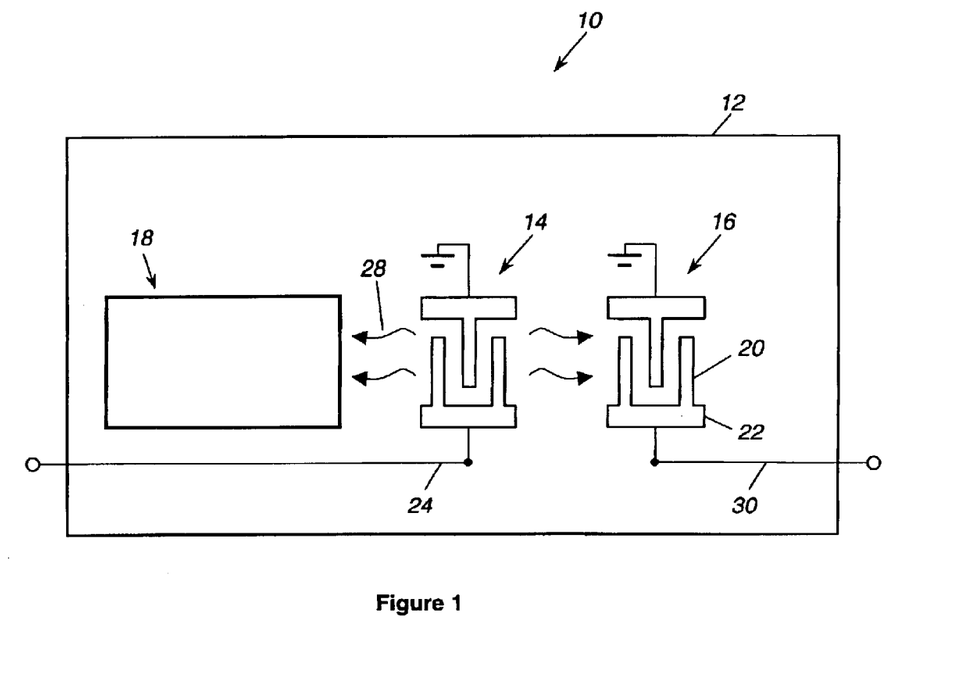
FIG. 1 is a top plan view of a reflector SAW filter including a reflective grating, according to an embodiment of the present invention.

FIG. 1 is a top view of a reflective SAW filter 10 fabricated on a piezoelectric substrate 12, according to an embodiment of the present invention. The reflective SAW filter 10 includes a bidirectional input transducer 14, an output bi-directional transducer 16, and a reflective grating 18, according to the invention. The input transducer 14 and the output transducer 16 include a plurality of uniformly spaced interdigital electrode fingers 20 attached at opposite ends by bus bars 22. The reflective SAW filter 10 is excited by an input signal that is to be filtered applied to the input transducer 14 on input line 24. The input transducer 14 converts the electrical signal into surface acoustic waves 28. The surface acoustic waves 28 propagate outward from the input transducer 12 along the surface of the piezoelectric substrate 12.

Approximately half of the acoustic waves 28 are received by the output transducer 16 where they are converted back into electrical energy on an output line 30. The other half of the acoustic propagated waves 28 are received by the reflective grating 18, and are then reflected back through the input transducer 14 to the output transducer 16 where they are converted back into electrical energy. In a working embodiment, the filter 10 would include two input transducers and two output transducers to correct for signal cancellation at the output transducer 16, as is well understood to those skilled in the art. As will be discussed below, the reflective grating 18 employs dithered grating lines that optimize the reflecting ability of the grating 18 for a particular wavelength.

It is noted that in order for the filter 10 to operate properly, a second reflective track should be included that also includes an input transducer, an output transducer and a reflective grating. The two input transducers would have the same polarity and the two output transducers would have opposite polarities. Thus, the surface acoustic waves that are directly received by the output transducer from the associated input transducer, and are not reflected by the reflective grating, are in phase with each other at the output transducer of the filter, and thus cancel because the two output transducers have opposite polarities. The acoustic waves that are reflected by the reflective gratings reach the associated output transducers 180° out of phase with each other, and therefore add at the output because the two output transducers have opposite polarities. The 180° phase difference between the grating reflections can be provided by several techniques, including providing a delay in one of the tracks relative to the other track where the acoustic waves in the two tracks propagate a λ/2 difference in distance. This delay can be provided by an offset between the reflective gratings in the two tracks of λ/4.

Figure 2:
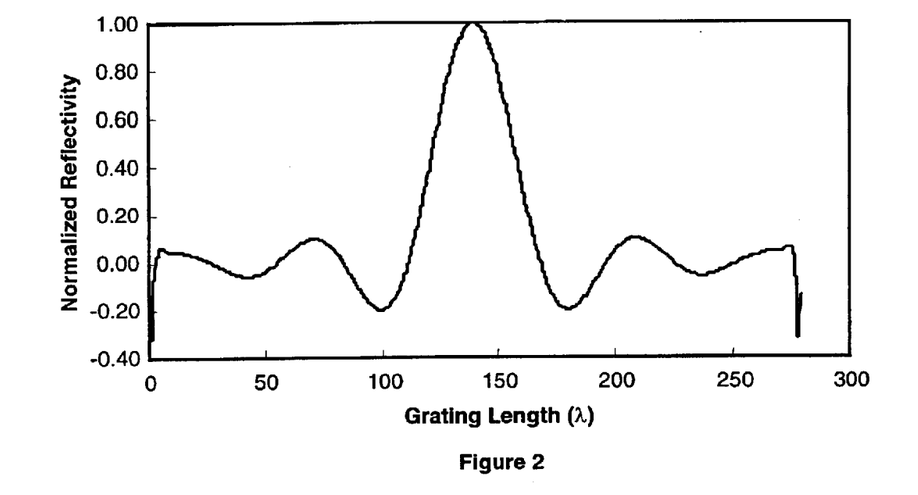
FIG. 2 is a graphical representation of the reflectivity function of a reflective grating, according to the invention, having a normalized λ/4 sampling period.

FIG. 2 is a graphical representation of the reflectivity function of the reflective grating 18 with λ/4 sampling. According to the invention, the sampling period is defined by M grid lines per each N wavelength (Nλ/M), where λ is the wavelength of the center frequency of the frequency band of interest, M and N are integers and M>N. Examples of sampling periods that satisfy this requirement include, but are not limited to, λ/4, λ/3, 2λ/5, 3λ/7, 3λ/8, 4λ/7, and 5λ/8. A characteristic of a sampling period meeting this requirement is that if the reflective grating 18 had grid lines that were uniformly spaced or periodic, i.e., no dithering, the grating 18 would have no net reflectivity. The critical dimension, CD, of the transducer is proportional to the grid line period, NUM. Since λ=V/fo, fo is proportional to N/(M*CD). The larger the ratio N/M, the higher the grating center frequency will be for a given CD.

As discussed above, a reflective grating having the Nλ/M orientation of grid lines would provide reflections of the surface acoustic waves within the grid lines that have the proper phase to destructively interfere and provide no net reflectivity. The desired reflectivity is achieved by dithering or changing the position of the grid lines relative to the uniform spacing according to a predetermined dithering function, discussed below. The dithering function is selected to control the magnitude and phase of the reflected acoustic waves so that they are coupled together to provide the desired reflection at the center of the frequency band of interest. The shape of the frequency response is an ideal reflectivity function that will produce a filter with ideal characteristics.

Figure 3:
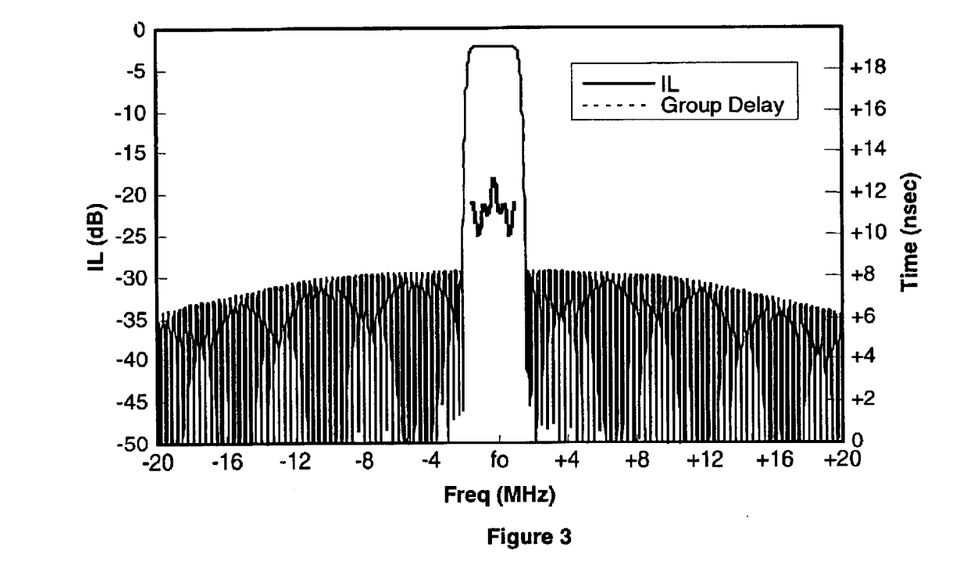
FIG. 3 is a graphical representation of the frequency response of a reflective grating, according to the invention, having a normalized λ/4 sampling period.

FIG. 3 is a graphical representation of the frequency response for the reflective grating 18 that has the reflective characteristics shown in FIG. 2. FIG. 3 illustrates what is known in the art as a "brick wall" frequency response. The brick wall frequency response is an ideal response that has steep transition edges and a narrow bandwidth. A reflective grating with the reflectivity function of FIG. 2 will produce the "brick wall" frequency response shown in FIG. 3.

Figure 4:
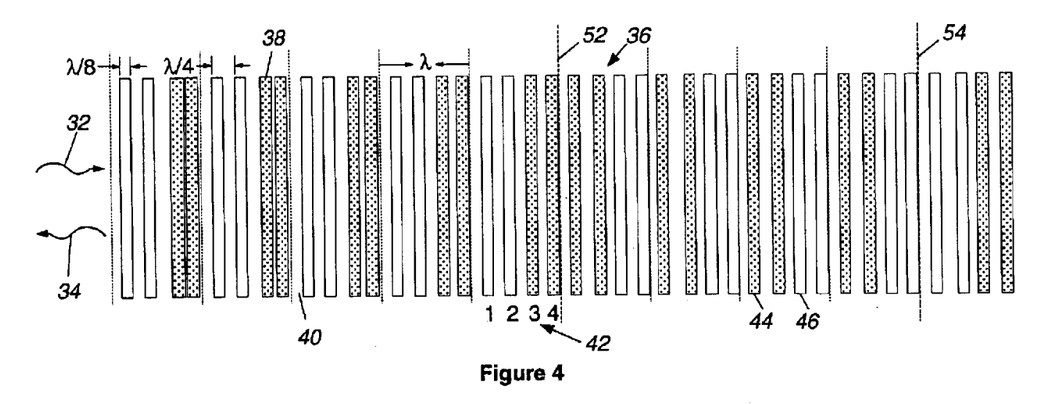
FIG. 4 is a top plan view of a weighted reflective grating that can be used in the SAW filter shown in FIG. 1, where the grating has sampling periods of λ and (0,0,1,−1) dithered grid lines in each period, according to an embodiment of the present invention.
Figure 5:
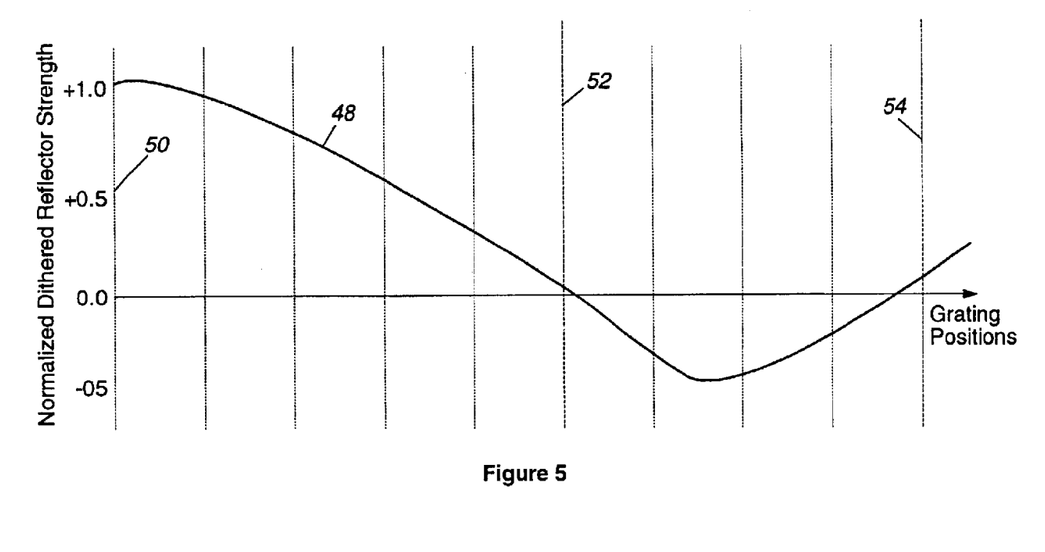
FIG. 5 is a graphical representation of dithered reflector strength vs grating position for the reflective grating shown in FIG. 4.

FIG. 4 is a top plan view of a reflective grating 36 that can be used in place of the reflective grating 18 in the filter 10, according to the present invention. FIG. 5 is a graphical representation of dithered reflector strength versus grating position for the grating 36. A graph line 48 identifies the magnitude and phase of the reflected surface acoustic waves at that location in the grating 36. As will be discussed below, the reflective grating 36 provides a reflectivity function so that an incident surface acoustic wave 32 is reflected back in the opposite direction as a reflected surface acoustic waves 34 having the desired amplitude and phase for the frequency band of interest.

The reflective grating 36 includes a series of spaced apart grid lines 38 defining gaps 40 therebetween. The width of the grid lines 38 and the gaps 40 are based on a uniform grid spacing of M grid lines 38 per each N$\lambda$, as discussed above. For a uniform or periodic grid line orientation, each of the grid lines 38 and the gaps 40 all have the same width in the propagation direction of the surface acoustic waves 32. The uniform grid line spacing thus provides no net reflectivity. In accordance with the teachings of the present invention, some of the grid lines 38 are dithered relative to the uniform spacing to provide the desired net reflectivity (phase and magnitude) for a particular center frequency. The dithered grid lines 44 in the grating 36 are identified from the non-dithered or uniform grid lines 46 by being shaded.

In this embodiment, the spacing of the grid lines 38 is identified by a sampling period 42, where each sampling period 42 includes four grid lines 38 spaced across a distance equal to one wavelength ($\lambda$) of the center frequency. Further, in this embodiment, each grid line 38 and uniform spacing gap 40 has a width of $\lambda/8$ relative to the center frequency being filtered. The vertical graph lines in FIGS. 4 and 5 identify the separation of the sampling periods 42. In one embodiment, the grating 36 has 275 sampling periods or is 275$\lambda$ long.

The dithering of the grid lines 38 follows a predetermined sequence. For example, between vertical graph lines 50 and 52 the dithering of the grid lines 38 in each sampling period 42 has one dithering orientation, and between the vertical graph lines 52 and 54 the dithering of the grid lines 38 in each sampling period 42 has another orientation, where the sequences alternate across the complete reflective grating 36. The phase of the reflectivity function changes by 180° from one side of the line 52 to the other.

According to the invention, the dithering of the grid lines 38 in the sampling period 42 is defined by a number between −1 and 1. A zero means that the grid line 38 has not been dithered relative to the uniform spacing, a positive number means that the grid line 38 has been dithered to the right a certain amount, and a negative number means that the grid line 38 has been dithered to the left a certain amount. In this example, −1 and 1 dithering represent the maximum distance that the grid line 38 can be dithered. In this embodiment, a −1 and 1 dithering is halfway across the gap 40. The amount of maximum dithering can be more than halfway across the gap as long as the critical dimension, which is the smallest gap in the grating, is within the feasible limit of lithography.

The dithering orientation in the sampling periods 42 between the vertical graph lines 50 and 52 is identified by the sequence (0, 0, 1, −1). The values in the dithering sequence show the relative displacement of each grid line within a sampling period. This means that the first and second grid lines 38 have not been dithered, the third grid line can be dithered to the right between zero and the maximum amount, and the fourth grid line 38 can be dithered to the left between zero and the maximum amount. However, both of the third and fourth grid lines within the same period will be dithered the same amount. The dithering orientation in the sampling periods 42 between the vertical graph lines 52 and 54 has the dithering sequence (−1, 1, 0, 0). This means that the first grid line 38 can be dithered between zero and the maximum distance to the left, the second grid line can be dithered between zero and the maximum distance to the right, and the third and fourth grid lines 38 have not been dithered relative to the uniform spacing. However, both the first and second grid lines within the same period will be dithered the same amount. The graph line 48 gives the magnitude and phase of the reflections for this dithered sequence. Since the SAW propagation velocity, V, is a function of the dithered magnitude, the $\lambda$ of each sampling period must be adjusted according to the dithered sequence in order for the SAW to propagate properly throughout the grating.

Figure 6:
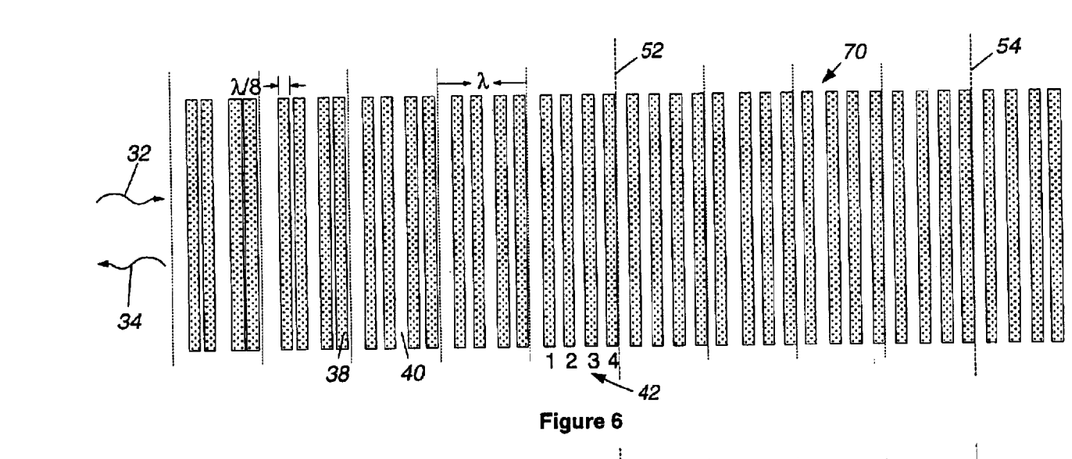
FIG. 6 is a top plan view of a weighted reflective grating that can be used in the SAW filter shown in FIG. 1, where the reflective grating has sampling periods of λ and (1, −1,1,−1) dithered grid lines in each period, according to another embodiment of the present invention.
Figure 7:
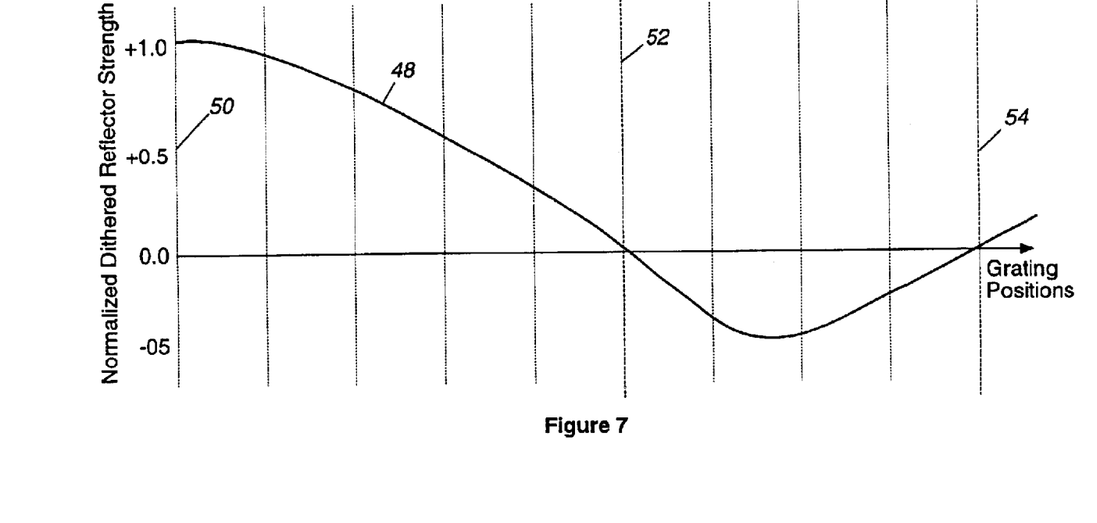
FIG. 7 is a graphical representation of dithered reflector strength vs grating position for the reflective grating shown in FIG. 6.

FIG. 6 is a top view of a reflective grating 70 that can be used as the reflective grating 18 in the filter 10, according to another embodiment of the present invention. FIG. 7 is a graphical representation of dithered reflective strength versus grating position of the grating 70, as will be discussed below. The reflective grating 70 is similar to the reflective grating 36 discussed above, where like referenced numerals will be used to identify the same elements. The sampling period 42 of the reflective grating 70 provides the same reflectivity function as the reflective grating 36, as shown by the graph line 48 in FIGS. 5 and 7.

The reflective grating 70 also includes a sampling period 42 of four grid lines 38, where N$\lambda$/M=$\lambda$/4. The dithered sequence of the grid lines 38 between the graph lines 50 and 52 is (1, −1, 1, −1), and the dithered sequence of the grid lines 38 between the graph lines 52 and 54 is (−1, 1, −1, 1). Therefore, all of the grid lines 38 in the grating 70 can be dithered between zero and the maximum amount, either to the right or to the left. However, all four grid lines within the same period will be dithered the same amount. Thus, the same reflectivity function can be provided by different dithered sequences.

The reflectivity phase changes by 180° by reversing the dithering direction of each reflection. In general, if the reflection center of one sampling period 42 is spatially offset by $\lambda/4$ with respect to that of another period, the reflectivities of the two periods will be 180° out of phase. It is clear from FIGS. 4–7 that as the values of the dithering sequence within each sampling period 42 decreases, the reflectivity magnitude of that period 42 decreases. Similar grating reflectivity can be achieved by using different sampling periods.

Figure 8:
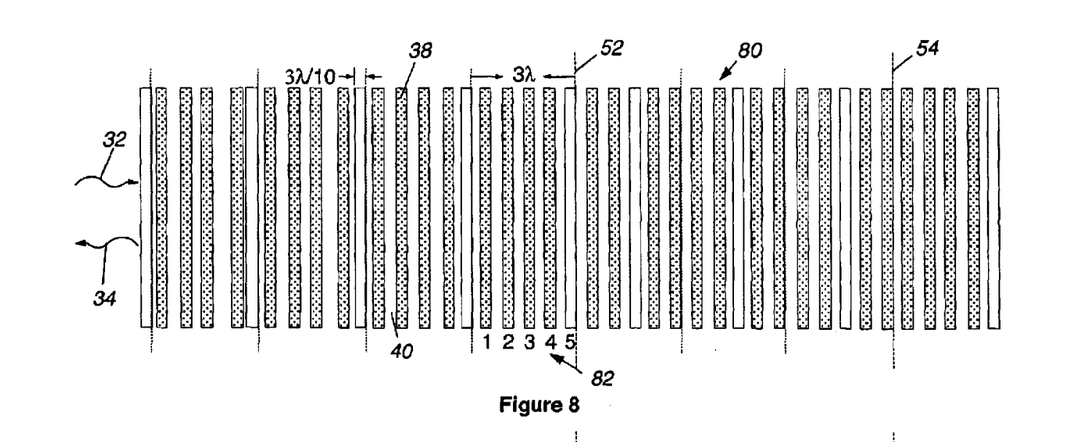
FIG. 8 is a top plan view of a weighted reflective grating that can be used in the SAW filter shown in FIG. 1, where the reflective grating has sampling periods of 3λ/5 and (1, −0.35, −0.35, 0.8, 1) dithered grid lines in each period, according to another embodiment of the present invention.
Figure 9:
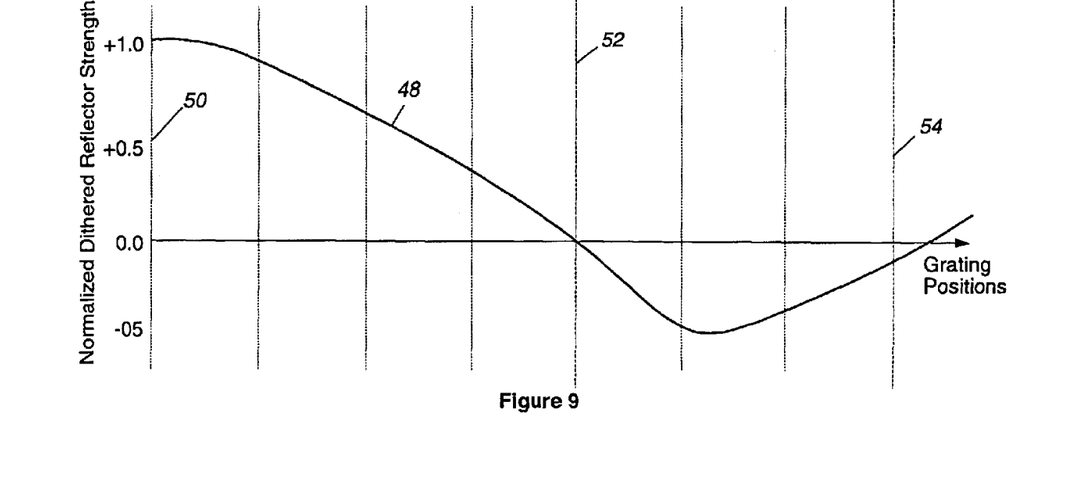
FIG. 9 is a graphical representation of dithered reflector strength vs grating position for the reflective grating shown in FIG. 8.

FIG. 8 is a top view of a reflective grating 80 that can be used as the reflective grating 18 in the filter 10, according to another embodiment of the present invention. Likewise, FIG. 9 is a graphical representation of dithered reflective strength versus grating position of the grating 80. As above, like referenced numerals represent like elements. The reflective grating 80 has a different sampling period 82 than the sampling period 42 shown in FIGS. 4 and 6 that can be employed to provide the same reflectivity function as shown in FIGS. 5, 7, and 9. In this embodiment, each sampling period 82 includes five grid lines 38 and has a width of 3$\lambda$. Further, each grid line 38 and each gap 40 has a width of 3$\lambda$/10. The dithering sequence for the section of the reflective grating 80 between the graph lines 50 and 52 is (−1, −0.35, −0.35, 0.8, 1), and the dithering sequence for the reflective grating 80 between the grid lines 52 and 54 is (0.35, 1, 0, −0.8, 0.35). Again, the values in the dithering sequence show the relative displacement of each grid line within a sampling period.

Figure 10A:
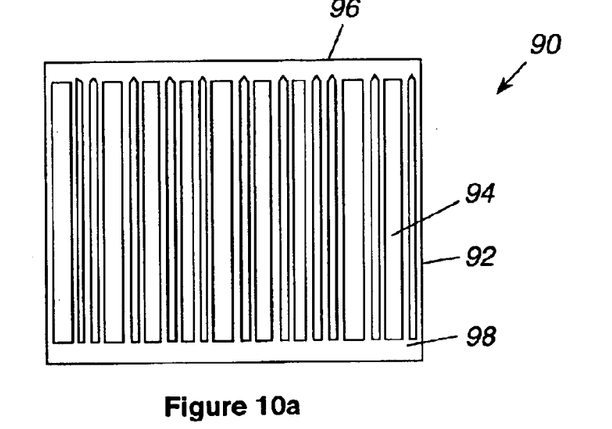
FIGS. 10(a)–10(c) show variations of the dithered grating structure of the invention.

The grid lines 38 can be formed on the piezoelectric substrate 12 by any suitable technique. For example, FIG. 10(a) is a top plan view of a reflective grating 90 having dithered grid lines 92 defining gaps 94 therebetween. The grid lines 92 are coupled at their ends to opposing end bus bars 96 and 98, as shown, to provide a grid short circuit. The reflective gratings 36, 70 and 80 do not have end bus bars, and thus provide an open circuited design. In this embodiment, the grid lines 92 and the bus bars 96 and 98 are metal deposited on the substrate.

Figure 10B:
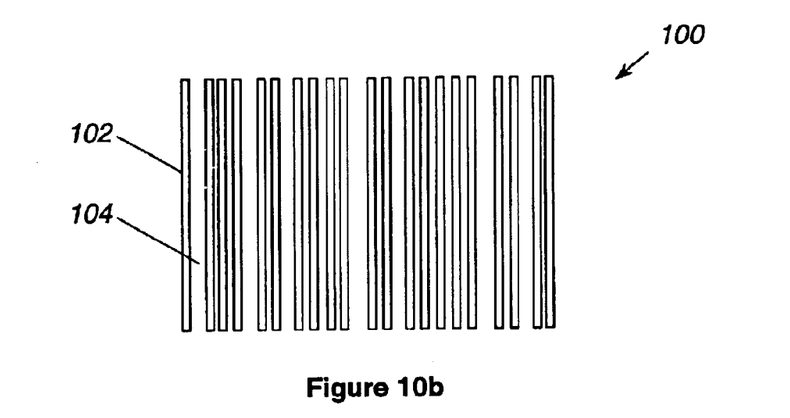

FIG. 10(b) is a top plan view of a reflective grating 100, according to the invention, including a series of spaced apart and dithered grid lines 102 defining gaps 104 therebetween. The grid lines 102 can be formed by any suitable grating material, such as metal, any suitable substance deposited on the substrate, an etched groove below the substrate, ion implantation into the substrate, or any kind of disturbance in the substrate that provides the particular desired dithered pattern.

Figure 10C:
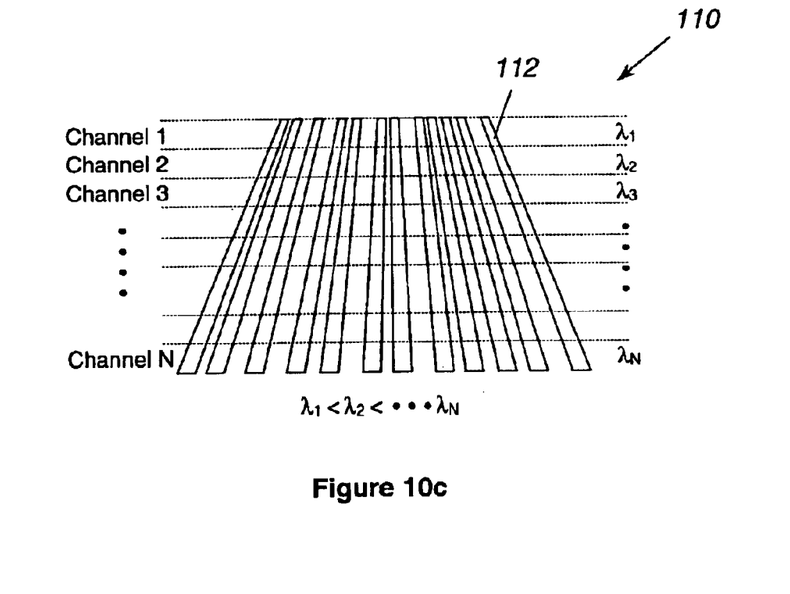

FIG. 10(c) is a top plan view of a grating 110 including tapered grid lines 112. The tapered grid lines 112 provide a suitable reflectivity channel for adjacent frequency bands for multiple communication channels. The grid lines 112 are provided by connecting N channels of grating lines from top to bottom in an ascending or descending order for the desired wavelengths. Various embodiments of the reflective gratings depicted in FIG. 10(a) and FIG. 10(b) can also be applied to the tapered reflective grating 112.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A reflector for reflecting acoustic waves, said reflector comprising:
   a substrate; and
   a reflective grating disposed on the substrate, said grating including patterned grid lines oriented in a parallel configuration and defining gaps therebetween, wherein the grid lines are oriented relative to a uniform or periodic spacing arrangement defined by a certain grid line width and gap width, and wherein a predetermined number of the grid lines are dithered relative to the uniform spacing to provide a reflectivity function that sets the magnitude and phase of the reflected waves relative to a frequency band of interest, and wherein the uniform spacing arrangement provides no net reflectivity.

2. The reflector according to claim 1 wherein the dithering of the grid lines is defined by a number from −1 to 1 where the number identifies in which direction and to what amount the grid line is dithered.

3. The reflector according to claim 1 wherein a certain number of the grid lines defines a predetermined and repeated sampling period.

4. The reflector according to claim 3 wherein the sampling period is determined by M number of grid lines per N wavelengths (NX/M), where λ is the wavelength of the center of the frequency band of interest, M and N are integers and M>N.

5. The reflector according to claim 4 wherein the sampling period is λ in length, the grid lines have a width of λ/8, N=1 and M=4.

6. The reflector according to claim 1 wherein all of the grid lines are dithered relative to the uniform spacing.

7. The reflector according to claim 1 wherein the reflective grating includes opposing end bus bars coupled to ends of the grid lines to provide a grid line short circuit.

8. The reflector according to claim 1 wherein ends of the grids are open circuited.

9. The reflector according to claim 1 wherein the grating is a tapered grating to create a wide fractional bandwidth frequency response.

10. The reflector according to claim 1 wherein the grid lines are selected from the group consisting of a metal deposited on the substrate, etched grooves in the substrate, ion implantation into the substrate, or a suitable material patterned on the substrate that forms the grid line pattern.

11. The reflector according to claim 1 wherein the substrate is a piezoelectric substrate.

12. The reflector according to claim 1 wherein the reflector is part of a surface acoustic wave reflector filter.

13. A reflector for reflecting acoustic waves, said reflector comprising:
   a piezoelectric substrate; and
   a reflective grating structure disposed on the substrate, said grating structure including a series of grid lines defining gaps therebetween, wherein the grid lines are oriented relative to a uniform or periodic spacing arrangement defined by a certain grid line width and gap width, and wherein a predetermined number of the grid lines are dithered relative to the uniform spacing to provide a reflectivity function that sets the magnitude and phase of the reflected wave relative to a frequency band of interest, and wherein a certain number of the grid lines define a predetermined and repeated sampling period, said sampling period being defined by M number of grid lines per N wavelengths (Nλ/M), where λ is the wavelength of the center of the frequency band of interest, M and N are integers and M>N, and wherein the uniform spacing arrangement provides no net reflectivity.

14. The reflector according to claim 13 wherein the dithering of the grid lines is defined by a number from −1 to 1 where the number identifies in which direction and to what amount the grid line is dithered.

15. The reflector according to claim 13 wherein the sampling period is λ in length, the grid lines have a width of λ/8, N=1 and M=4.

16. The reflector according to claim 13 wherein all of the grid lines are dithered relative to the uniform spacing.

17. The reflector according to claim 13 wherein the reflective grating structure includes opposing end bus bars coupled to ends of the grid lines to provide a grid line short circuit.

18. The reflector according to claim 13 wherein ends of the grids are open circuited.

19. The reflector according to claim 13 wherein the grating structure is a tapered grating structure to create a wide fractional bandwidth frequency response.

20. The reflector according to claim 13 wherein the grid lines are selected from the group consisting of a metal deposited on the substrate, etched grooves in the substrate, ion implantation into the substrate, or a suitable material patterned on the substrate that forms the grid line pattern.

21. The reflector according to claim 13 wherein the reflector is part of a surface acoustic wave reflector filter.

22. A SAW filter for filtering a signal, said filtering comprising:
 a piezoelectric substrate;
 at least one input transducer, said input transducer generating surface acoustic waves propagating on the piezoelectric substrate in response to the signal;
 at least one reflective grating for reflecting the acoustic waves from the at least one input transducer, said grating including patterned grid lines oriented in a parallel configuration and defining gaps therebetween, wherein the grid lines are oriented relative to a uniform or periodic spacing arrangement defined by a certain grid line width and gap width, and wherein a predetermined number of the grid lines are dithered relative to the uniform spacing to provide a reflectivity function that sets the magnitude and phase of the reflected waves relative to a frequency band of interest; and
 at least one output transducer, said output transducer responsive to the reflected acoustic waves from the reflective grating, said at least one output transducer converting the acoustic waves into electrical energy, and wherein the uniform spacing arrangement provides no net reflectivity.

23. The reflector according to claim 22 wherein the dithering of the grid lines is defined by a number from −1 to 1 where the number identifies in which direction and to what amount the grid line is dithered.

24. The reflector according to claim 22 wherein a certain number of the grid lines defines a predetermined and repeated sampling period.

25. The reflector according to claim 24 wherein the sampling period is determined by M number of grid lines per N wavelengths (N$\lambda$/M), where $\lambda$ is the wavelength of the center of the frequency band of interest, M and N are integers and M>N.

26. The reflector according to claim 22 wherein the reflective grating includes opposing end bus bars coupled to ends of the grid lines to provide a grid line short circuit.

27. The reflector according to claim 22 wherein the ends of the grids are open circuited.

28. The reflector according to claim 22 wherein the grid lines are tapered grid lines to create a wide fractional frequency response.

29. The reflector according to claim 22 wherein the grid lines are selected from the group consisting of a metal deposited on the substrate, etched grooves in the substrate, ion implantation into the substrate, or a suitable material patterned on the substrate that forms the grid pattern.

* * * * *